United States Patent
Ullrich et al.

(10) Patent No.: US 9,625,489 B2
(45) Date of Patent: Apr. 18, 2017

(54) MICROMECHANICAL SENSOR AND METHOD FOR MANUFACTURING A MICROMECHANICAL SENSOR

(71) Applicant: Robert Bosch GmbH, Stuttgart (DE)

(72) Inventors: Guenther-Nino-Carlo Ullrich, Reutlingen (DE); Andrea Orto, Dunavjvaros (HU)

(73) Assignee: ROBERT BOSCH GMBH, Stuttgart (DE)

(*) Notice: Subject to any disclaimer, the term of this patent is extended or adjusted under 35 U.S.C. 154(b) by 318 days.

(21) Appl. No.: 14/468,221

(22) Filed: Aug. 25, 2014

(65) Prior Publication Data

US 2015/0053002 A1 Feb. 26, 2015

(30) Foreign Application Priority Data

Aug. 26, 2013 (DE) .................. 10 2013 216 915

(51) Int. Cl.
| | |
|---|---|
| *G01P 15/00* | (2006.01) |
| *G01P 15/125* | (2006.01) |
| *B81B 3/00* | (2006.01) |
| *B81C 1/00* | (2006.01) |
| *G01P 15/08* | (2006.01) |

(52) U.S. Cl.
CPC .......... *G01P 15/125* (2013.01); *B81B 3/0027* (2013.01); *B81B 3/0045* (2013.01); *B81C 1/00134* (2013.01); *B81B 2201/0235* (2013.01); *B81B 2203/058* (2013.01); *G01P 2015/0831* (2013.01); *G01P 2015/0871* (2013.01); *G01P 2015/0882* (2013.01)

(58) Field of Classification Search
CPC .............. G01P 15/02; G01P 2015/0805; G01P 2015/0817; G01P 2015/0831; G01P 2015/0834; G01P 2015/0857; G01P 2015/086; G01P 2015/0862; G01P 2015/0882; G01P 15/125; B81B 3/0045; B81B 2201/0235; B81B 2203/058; B81C 1/00134
USPC .............. 73/514.14, 514.15, 514.21, 514.24, 73/514.36, 514.38
See application file for complete search history.

(56) References Cited

U.S. PATENT DOCUMENTS

| | | | | |
|---|---|---|---|---|
| 2010/0186508 | A1* | 7/2010 | Guenther | G01C 25/00 73/504.14 |
| 2012/0186346 | A1* | 7/2012 | McNeil | G01P 15/125 73/514.32 |
| 2012/0297879 | A1* | 11/2012 | Ullrich | G01P 15/125 73/514.32 |

* cited by examiner

*Primary Examiner* — Benjamin Schmitt
(74) *Attorney, Agent, or Firm* — Gerard Messina

(57) ABSTRACT

A micromechanical sensor is provided which includes a substrate having a main plane of extension and a rocker structure which is connected to the substrate via a torsion means. The torsion means extends primarily along a torsion axis, and the torsion axis is situated essentially in parallel to the main plane of extension of the substrate. The rocker structure is pivotable about the torsion axis from a neutral position into a deflected position, and the rocker structure has a mass distribution which is asymmetrical with respect to the torsion axis. The mass distribution is designed in such a way that a torsional motion of the rocker structure about the torsion axis is effected as a function of an inertial force which is oriented along a Z direction which is essentially perpendicular to the main plane of extension of the substrate.

19 Claims, 17 Drawing Sheets

Fig. 4
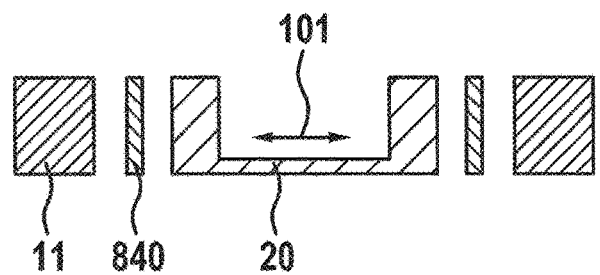
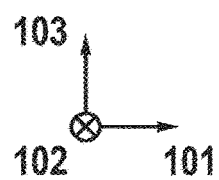
Fig. 5
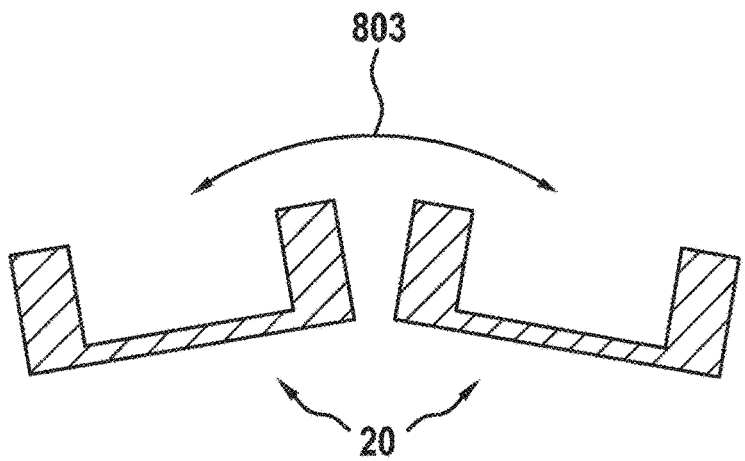
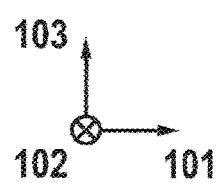

Fig. 16
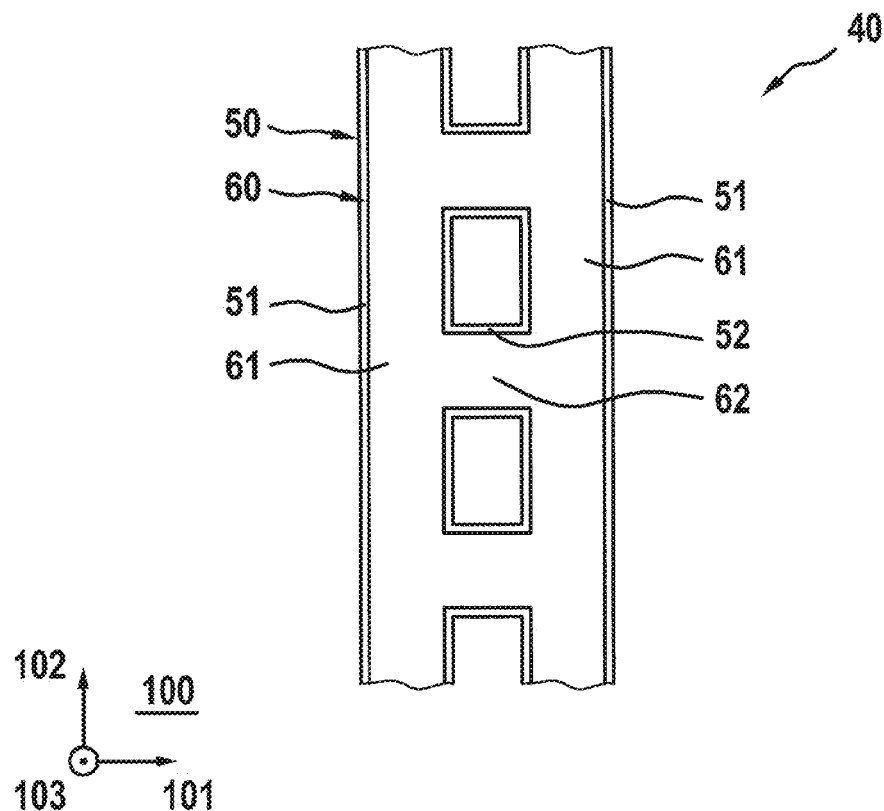
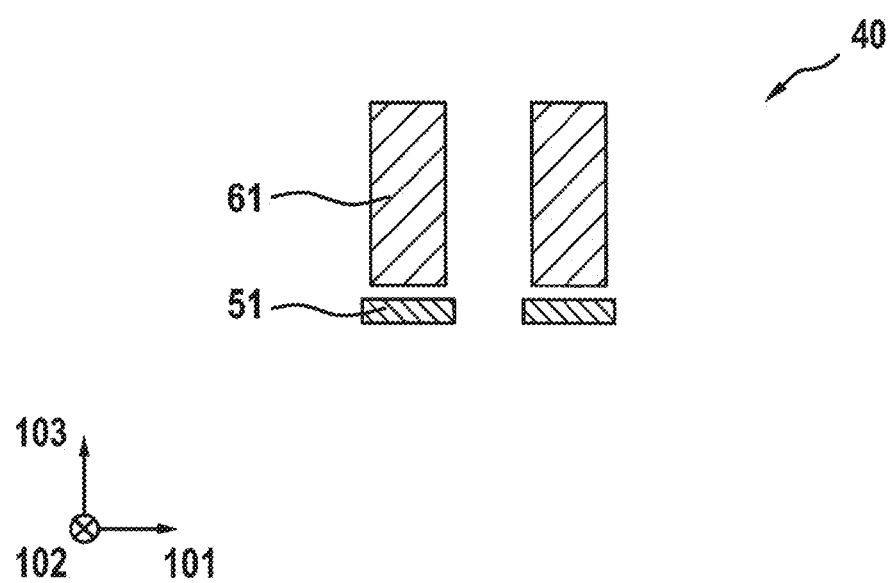

MICROMECHANICAL SENSOR AND METHOD FOR MANUFACTURING A MICROMECHANICAL SENSOR

FIELD OF THE INVENTION

The present invention is directed to a micromechanical sensor.

BACKGROUND INFORMATION

Such micromechanical sensors are generally known. For example, for measuring accelerations, recent micromechanical sensors include a micromechanical structure made of silicon (sensor core) situated on a substrate and an evaluation electronics system. A micromechanical sensor which is configured for detecting an acceleration oriented along a Z direction which is orthogonal with respect to the main plane of extension of the substrate is typically referred to as a Z sensor. The sensor core of such a Z sensor has in particular a movable rocker structure which is pivotable about a torsion axis in parallel to the main plane of extension, from a neutral position into a deflected position.

SUMMARY

An object of the present invention is to provide an improved micromechanical sensor which is comparatively insensitive to external interferences.

The micromechanical sensor according to the present invention and the method according to the present invention for manufacturing a micromechanical sensor according to the other independent claims have the advantage over the related art that the micromechanical sensor is comparatively robust with respect to interfering mechanical vibrations. It is thus advantageously possible to use the sensor in particular in an engine compartment of a motor-driven device such as a motor vehicle, since in this case the micromechanical sensor is comparatively robust with respect to vibrations which arise due to operation of the engine. The micromechanical sensor, also referred to below simply as "sensor," preferably has a spring system which includes the torsion means; the spring system, in particular the torsion means of the spring system, is configured in such a way that the first resonant frequency of the torsion mode is less than the second resonant frequency of the vibration mode of the rocker structure, the vibration mode including one or multiple vibration motions of the rocker structure along the plane of vibration. A separation of an excitation frequency of a spurious mode, of the interfering mechanical vibration, for example, and the first resonant frequency of the rocker structure is thus advantageously achieved, the rocker structure still being comparatively insensitive to accelerations in parallel to the main plane of extension of the substrate. Due to this comparatively high level of insensitivity of the sensor, a deflection of the rocker structure out of the plane of vibration caused by such external interferences or accelerations oriented in parallel to the main plane of extension is advantageously largely avoided; i.e., the rocker structure has a comparatively low cross-sensitivity. In addition, due to the damping structure according to the present invention, a movement of the rocker structure along the plane of vibration is damped, in particular additionally damped, relatively well.

Advantageous embodiments and refinements of the present invention are apparent from the subclaims and from the description, with reference to the drawings.

According to one preferred refinement it is provided that the vibrational motion includes the translational motion of the rocker structure along the X direction, the X direction being situated essentially perpendicularly with respect to the torsion axis, and/or the vibrational motion includes a rotary motion of the rocker structure about an axis which is essentially in parallel to the Z direction.

It is thus advantageously possible to easily and efficiently damp numerous different vibrational motions, so that the micromechanical sensor is comparatively insensitive to external interferences.

According to another preferred refinement, it is provided that the torsion means has a torsion means length which extends along the torsion axis from one end to another end of the torsion means, the torsion means length being less than one-half, preferably less than one-third, particularly preferably less than one-fourth, very particularly preferably less than one-fifth, of a rocker width of the rocker structure which extends along the torsion axis, and/or the first torsion element having the torsion means length along the first main direction of extension, the second torsion element having the torsion means length along the second main direction of extension, the first and second torsion elements being connected to one another, in particular solely indirectly, via two or more connecting elements, the two or more connecting elements being situated at a distance from one another along the Y direction.

By greatly shortening the torsion means and/or the further torsion means and appropriately adjusting the first and/or second torsion element structure width, it is thus advantageously possible to increase a spring stiffness with respect to the vibrational motion along the plane of vibration (so-called in-plane stiffness) of the torsion means and/or of the further torsion means in such a way that the second resonant frequency or natural frequency of the rocker structure disproportionately increases with respect to the first resonant frequency. In addition, the first resonant frequency advantageously remains essentially unchanged, so that in particular the mechanical sensitivity or cross-sensitivity of the rocker structure is comparatively low. As a result, the rocker structure is typically excited by interfering vibrations to undergo vibrational motion along the plane of vibration at the second frequency, which is greatly different from the first frequency of the torsion mode. Such vibrations which interfere with the operation of the sensor are usually low-frequency vibrations, i.e., in particular between 2,000 Hertz (Hz) and 10,000 Hz, the second resonant frequency preferably being greater than 10,000 Hz. As a result, the amplitude of the torsion mode is advantageously in a range which is comparatively favorable for the particular intended purpose, for example, so that an impact on the rocker structure is essentially avoided.

According to another preferred refinement, it is provided that the rocker structure includes a further torsion means which extends primarily along the torsion axis, the torsion means and the further torsion means in each case being connected to the rocker structure at ends facing away from each other, and in each case being connected to the substrate at ends facing each other via an anchoring element situated between the torsion means and the further torsion means, the torsion means length of the torsion means and a further torsion means length of the further torsion means being essentially equal.

Due to two essentially identical torsion means, it is thus advantageously possible to achieve a comparatively high level of insensitivity of the micromechanical sensor to external interferences. The torsion means and/or the further torsion means is/are preferably a torsion spring in each case. According to the present invention, the anchoring element very particularly preferably includes an anchoring bar element and a further anchoring bar element which in particular have a self-supporting design in each case. The rocker structure is preferably connected to the stationary part of the substrate solely via the anchoring element, and the anchoring element is particularly preferably only partially connected to the stationary part of the substrate, i.e., in particular the anchoring bar element being connected to the stationary part of the substrate solely indirectly via the anchoring element. The connection of the anchoring element is particularly preferably as small as possible in order to minimize deformations of the substrate on the rocker structure. Such deformations are caused by thermally induced mechanical stresses, for example. In addition, the anchoring bar element particularly preferably has a rigid design in comparison to the torsion means, or has a comparatively high stiffness. The anchoring element, which includes the two anchoring bar elements, is very particularly preferably situated along the torsion axis between the two torsion means, and the two torsion means are situated along the torsion axis at opposite outer ends of the torsion axis. Due to a higher spring stiffness thus achieved with respect to the vibration mode, i.e., the undesirable vibrational motion along the plane of vibration, i.e., the "in-plane" vibration mode, it is particularly advantageous that the second resonant frequency of the vibration mode is less than the first resonant frequency of the torsion mode.

According to another preferred refinement, it is provided that the first torsion element has a first torsion element structure width which extends essentially in parallel to the main plane of extension, and a first torsion element structure height which extends essentially in parallel to the Z direction, the second torsion element having a second torsion element structure width which extends essentially in parallel to the main plane of extension, and a second torsion element structure height which extends essentially in parallel to the Z direction, the first and second torsion element structure widths and/or the first and second torsion element structure heights being configured in such a way that the first resonant frequency is less than the second resonant frequency, preferably by one order of magnitude,
the first torsion element structure width preferably being 0.5 times to 2 times, particularly preferably 0.8 times to 1.4 times, very particularly preferably 1.0 times to 1.2 times, the second torsion element structure width, and/or
the first torsion element structure height preferably being 0.01 times to 0.4 times, particularly preferably 0.05 times to 0.2 times, very particularly preferably essentially 0.1 times, the second torsion element structure height.

It is thus advantageously possible to provide an improved micromechanical sensor in which the torsion means preferably has an i shape or an inverted i shape, as a result of which the cross-sensitivity of the rocker structure is advantageously comparatively low. In addition, the spring system, i.e., the torsion means, is configured in such a way that an undesirable movement of the rocker structure out of the plane of vibration due to external interference is greatly reduced.

According to another preferred refinement, it is provided that
the first torsion element has a first ladder structure and/or the second torsion element has a second ladder structure, the first and/or second ladder structure(s) each having two side rail elements which are connected to one another via multiple transverse webs, and/or
the first torsion element extends essentially along the first main direction of extension in a meandering manner and/or the second torsion element extends essentially along the second main direction of extension in a meandering manner.

Due to the ladder shape of the first and/or second torsion element(s), it is thus advantageously possible to implement a ladder spring, the side rail elements in particular likewise essentially having the i shape. The spring stiffness is thus advantageously increased with regard to a vibrational motion along the plane of vibration without changing a torsional stiffness with respect to the torsion mode, i.e., the torsional motion about the torsion axis. A separation of the first and second resonant frequencies is thus achieved without significantly changing the cross-sensitivity.

According to another preferred refinement, it is provided that the damping structure is configured for damping the translational motion of the rocker structure along the X direction and/or for damping the rotary motion of the rocker structure about the axis, in particular the damping structure including one or multiple damping elements, in particular the one or multiple damping elements being situated in a recess in the rocker structure which extends through the rocker structure along a projection direction which is essentially in parallel to the Z direction, and/or being situated on a first side, a second side, a third side, and/or a fourth side, preferably on opposite sides, of the rocker structure, in the neutral position in particular the first, second, third, and/or fourth side(s) in each case being situated in the plane of vibration and/or being situated between the substrate and the rocker structure along a projection direction in parallel to the Z direction and/or being situated above the rocker structure along a projection direction in parallel to the Z direction.

It is thus advantageously possible to increase the damping of the vibrational motion along the plane of vibration (in-plane damping) via additional damping structures. In particular, the damping structures generate damping forces as a function of the vibrational motion which counteract the vibrational motion. A translational motion and/or rotary motion is/are advantageously damped by arranging the damping elements on different sides of the rocker structure. An improved sensor which is less sensitive to interfering mechanical vibrations is thus advantageously provided.

According to another preferred refinement, it is provided that each of the one or multiple damping elements of the damping structure includes a damping electrode which is immovably connected to the rocker structure, and a corresponding damping counter electrode which is immovably connected to the substrate, in particular the one or multiple damping elements in each case being configured for damping with the aid of sliding film damping and/or squeeze film damping.

It is thus advantageously possible to easily and efficiently damp the vibrational motions so that the micromechanical sensor is comparatively insensitive to external interferences.

According to another preferred refinement, it is provided that the damping electrode includes multiple finger electrodes, and the damping counter electrode includes multiple counter finger electrodes, the multiple finger electrodes each having a finger structure height which extends along the Z direction, the rocker structure having a rocker structure height which extends along the Z direction, the finger structure height being essentially less than the rocker structure height.

It is thus advantageously possible to easily and efficiently damp a vibrational motion so that the micromechanical sensor is comparatively insensitive to external interferences, and at the same time, an impact of the rocker structure against the stop elements fixed to the substrate is avoided, so that in particular an improved micromechanical sensor is provided.

Exemplary embodiments of the present invention are illustrated in the drawings and explained in greater detail in the following description.

BRIEF DESCRIPTION OF THE DRAWINGS

FIGS. 4 and 5 show a rocker structure of a micromechanical sensor according to various specific embodiments of the present invention.

FIGS. 6 through 19 show a micromechanical sensor according to various specific embodiments of the present invention.

DETAILED DESCRIPTION

Figure 1:
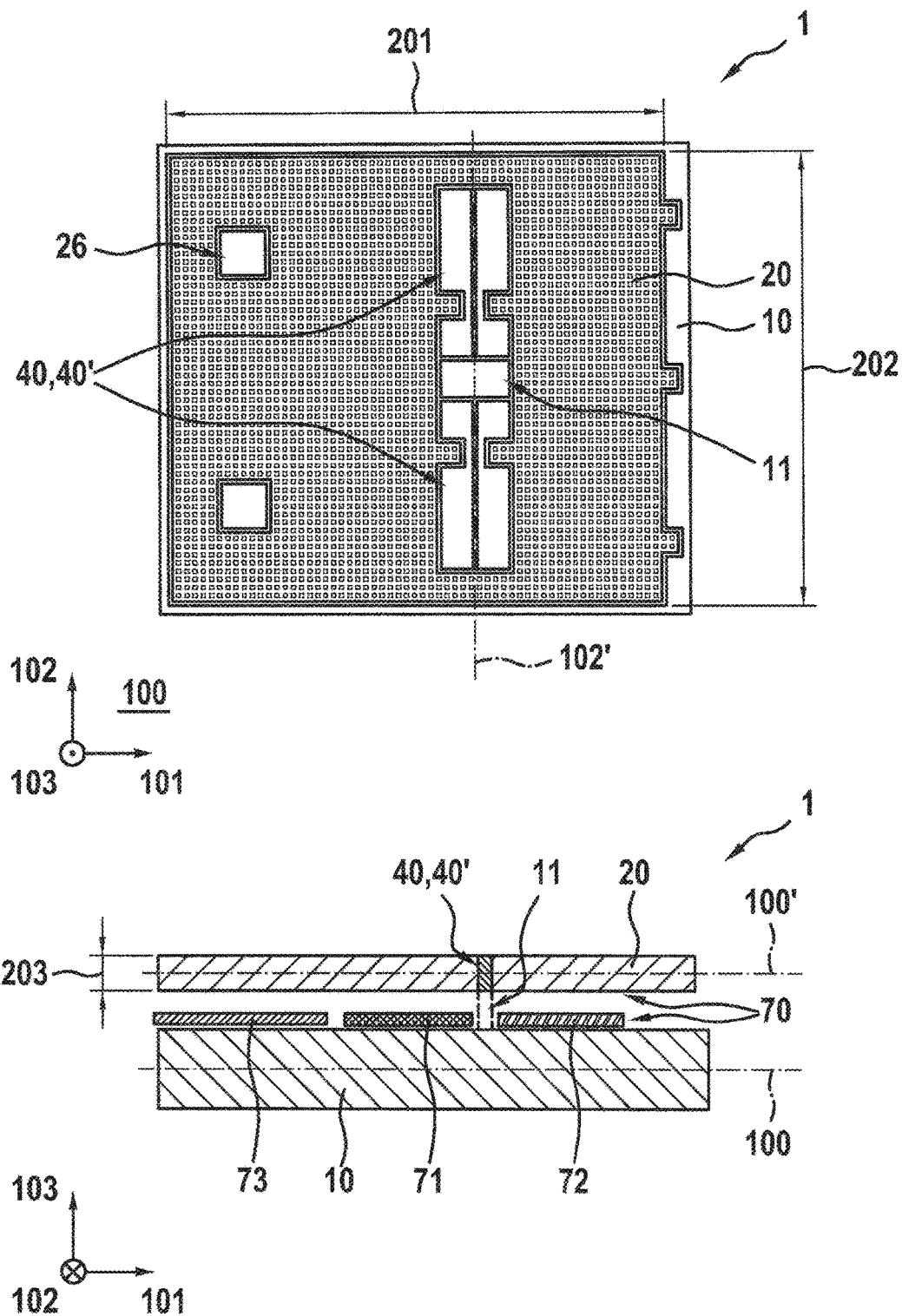
FIGS. 1 through 3 show a micromechanical sensor according to various specific embodiments of the present invention.

Identical parts are always provided with the same reference numerals in the various figures, and therefore are generally designated or mentioned only once in each case.

FIG. 1 illustrates a micromechanical sensor 1 according to one specific embodiment of the present invention, micromechanical sensor 1 being illustrated here in a schematic top view (FIG. 1, top) and a side view (FIG. 1, bottom).

Micromechanical sensor 1 includes a substrate 10 having a main plane of extension and a rocker structure 20 which is connected to substrate 10 via a torsion means 40. Torsion means 40 extends primarily along a torsion axis 102', torsion axis 102' being situated essentially in parallel to main plane of extension 100 of substrate 10. In the present case, torsion axis 102' extends essentially in parallel to a Y direction 102.

A direction which is essentially perpendicular to Y direction 102 and essentially in parallel to main plane of extension 100 is referred to here as X direction 101, and a direction which is essentially perpendicular to main plane of extension 100 is referred to as Z direction 103.

In particular, the rocker structure here includes a torsion means 40 and a further torsion means 40', each of which extends primarily along torsion axis 102' and is connected to a connecting element 11 fixed to the substrate and to movable rocker structure 20.

Rocker structure 20 is pivotable about torsion axis 102' from a neutral position into a deflected position. Rocker structure 20 has a mass distribution which is asymmetrical with respect to torsion axis 102' and which is designed in such a way that a torque about torsion axis 102' is generated on rocker structure 20 as a function of an inertial force which is oriented along a Z direction 103 which is essentially perpendicular to main plane of extension 100 of substrate 10. Rocker structure 20 is excited to undergo a torsional motion about torsion axis 102', i.e., is excited into the torsion mode of rocker structure 20, as a function of the torque.

Rocker structure 20 here is in particular rectangular, in the present case rocker structure 20 extending in parallel to X direction 101 along a rocker length 201 and in parallel to Y direction 102 along a rocker width 202. In the neutral position, rocker structure 20 here extends primarily along a plane of vibration 100' which is essentially in parallel to main plane of extension 100. In addition, rocker structure 20 has a rocker height 203 which extends in parallel to Z direction 103. For delimiting an amplitude of the torsion mode, micromechanical sensor 1 has in particular two stop elements 26 fixed to the substrate which prevent rocker structure 20 or mass 20 from reaching a critical deflection during a lateral overload acceleration. In addition, rocker structure 20 has a plurality of perforations which in each case extend through rocker structure 20 along a projection direction in parallel to Z direction 103.

In the present case, micromechanical sensor 1 has an electrode system 70 which includes rocker structure 20, a first electrode 71, a second electrode 72, and a third electrode 73. First, second, and third electrodes 71, 72, 73, respectively, are situated between substrate 10 and rocker structure 20, and in particular overlap with rocker structure 20, along a projection direction in parallel to Z direction 103. Rocker structure 20, also referred to as rocker 20 here, and third electrode 73 are acted on by an electrical potential, denoted by reference character CM, via an electronic circuit (not illustrated). First electrode 71 is acted on by an electrical potential denoted by reference character C1, and second electrode 72 is acted on by an electrical potential denoted by reference character C2. In particular a torsion or inclination of rocker structure 20 about torsion axis 102', for example, as a function of the inertial force, is detected as a function of a change in capacitance of a capacitor between rocker structure 20 and first electrode 71 and/or between rocker structure 20 and second electrode 72.

Figure 2:
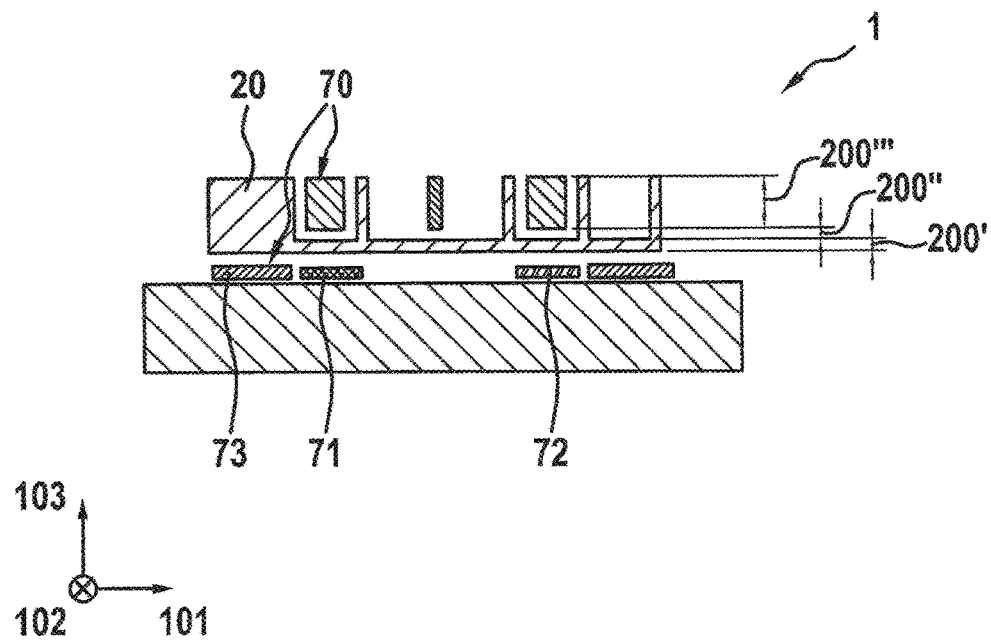

FIG. 2 illustrates a micromechanical sensor 1 according to one specific embodiment of the present invention in a schematic side view, the specific embodiment illustrated here corresponding essentially to the specific embodiment illustrated with reference to FIG. 1. In the present case, rocker structure 20 has a layer structure having a first, second, and third layer 200', 200'', 200''', respectively, which are situated one above the other along Z direction 103. Second layer 200''' is situated between first layer 200' and third layer 200'' along Z direction 103. In particular, first layer 200' contains functional polysilicon (FP), first layer 200' also being referred to as "FP layer." Second and/or third layer 200'', 200''', respectively, each contain(s) epitactic polysilicon, third layer 200''' also being referred to as "EP layer" here. Second layer 200'' is preferably either a sacrificial layer or an oxide layer. In particular, rocker structure 20, which has the layer structure, is produced with the aid of FP technology, in particular a trough-shaped rocker structure 20 advantageously being formed from first, second, and third layer 200', 200'', 200''', respectively. Torsion spring 40 and/or further torsion spring 40' is/are preferably formed from first, second, and third layer 200', 200'', 200''', respectively, with the aid of the FP technology.

Figure 3:
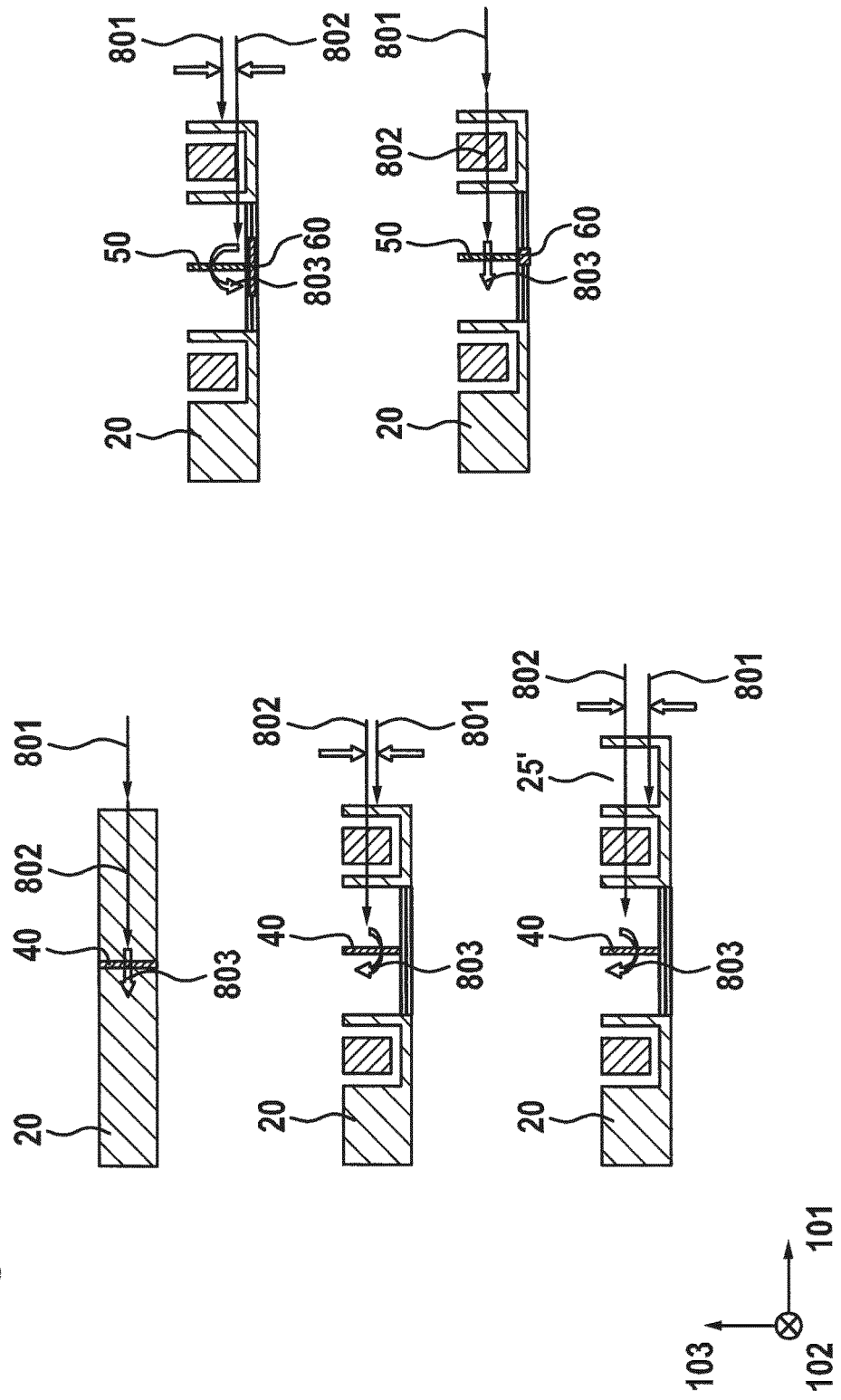

FIG. 3 illustrates a micromechanical sensor 1 according to one specific embodiment of the present invention, the specific embodiments illustrated here corresponding essentially to the specific embodiments illustrated with reference to FIGS. 1 and 2.

According to one alternative specific embodiment, torsion spring 40 and/or a further torsion spring each include(s) a T structure having a narrow vertical bar which in particular has a height of 20 microns and a width of 3 microns, and a comparatively wide, comparatively thin cross bar having a height of approximately 2 microns and a width of approximately 40 microns. The cross bar is situated in particular below the vertical bar along Z direction 103. The stiffness of torsion means 40 is thus advantageously increased with respect to a vibrational motion along plane of vibration 100', but a structure having such a design is comparatively sensitive to transverse accelerations oriented along the plane of vibration; i.e., rocker structure 20 is cross-sensitive.

The top left portion of FIG. 3 illustrates a rocker structure 20 which is formed from a single layer, rocker structure 20 here being deflected solely along X direction 101, but not along Z direction 103, as a function of a lateral transverse acceleration, i.e., oriented in parallel to X direction 101, on a center of mass (see arrow 801) of rocker structure 20 (see arrow 803), so that no false signal is generated. Arrow 803 indicates a position of a center of rotation which is situated here along Z direction 103 in a central area of rocker structure 20. The center left, bottom left, and top right portions of FIG. 3 in each case illustrate a rocker structure 20 which is formed from the first, second, and third layer 200', 200'', 200''', respectively, the center of rotation (illustrated by arrow 802) and the center of mass (arrow 801) being situated one above the other and at a distance from one another along Z direction 103. As a result, the rocker structure is deflected out of plane of vibration 100' as a function of the transverse acceleration in parallel to main plane of extension 100 (illustrated by arrows 803). In the top right portion of FIG. 3, torsion means 40 has a T shape, the transverse acceleration causing a deflection of rocker structure 20 out of plane of vibration 100', but in the opposite rotational direction. According to the present invention, torsion means 40 preferably has the i shape, also referred to as "i spring," illustrated in the lower right portion of FIG. 3, torsion means 40 which is designed as an i spring in particular being configured in such a way that rocker structure 20 has no cross-sensitivity, i.e., is deflected solely along plane of vibration 100' and not out of plane of vibration 100', as a function of a transverse acceleration in parallel to plane of vibration 100'.

FIGS. 4 and 5 illustrate a rocker structure 20 of a micromechanical sensor 1 according to one specific embodiment of the present invention, rocker structure 20 illustrated here corresponding essentially to rocker structures 20 illustrated with reference to FIGS. 1 through 3. In the present case, the rocker structure is connected to substrate 10 via a translational spring 840 on an anchoring element 11, and is linearly deflectable along X direction 101. The rocker structure here has a trough shape (FIG. 4), a center of mass being situated in such a way that a deflection (illustrated by arrow 803) of rocker structure 20 out of plane of vibration 100' is caused as a function of the transverse acceleration (FIG. 5).

FIGS. 6 through 19 illustrate micromechanical sensors 1 according to various specific embodiments of the present invention, the specific embodiments illustrated here essentially corresponding to one another and to the specific embodiments illustrated with reference to FIGS. 1 through 5.

Figure 6:
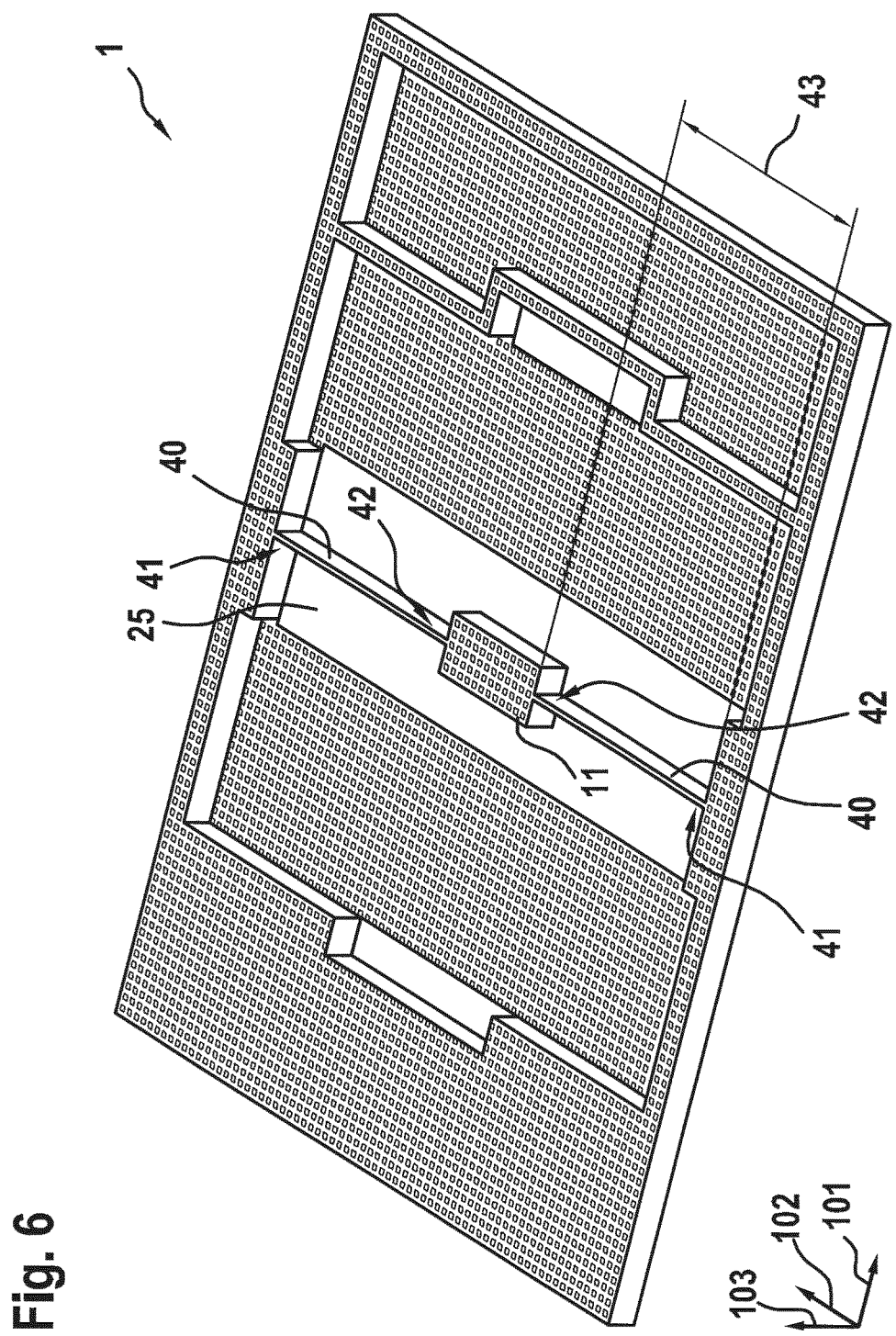

FIG. 6 illustrates a micromechanical sensor 1 according to one specific embodiment of the present invention. In the present case, torsion means 40 and further torsion means 40' are each connected to the rocker structure via one end 41, and are connected to an anchoring element 11, fixed to the substrate, via other end 42, torsion means 40 and further torsion means 40' each extending along torsion axis 102', anchoring element 11 being situated between the two torsion means 40, 40'. The two torsion means 40, 40' each have a torsion means length 43 which extends between end 41 and other end 42 along torsion axis 102'. In addition, rocker structure 20 in particular has a recess in which the two torsion means 40, 40' and anchoring element 11 are situated.

Figure 7:
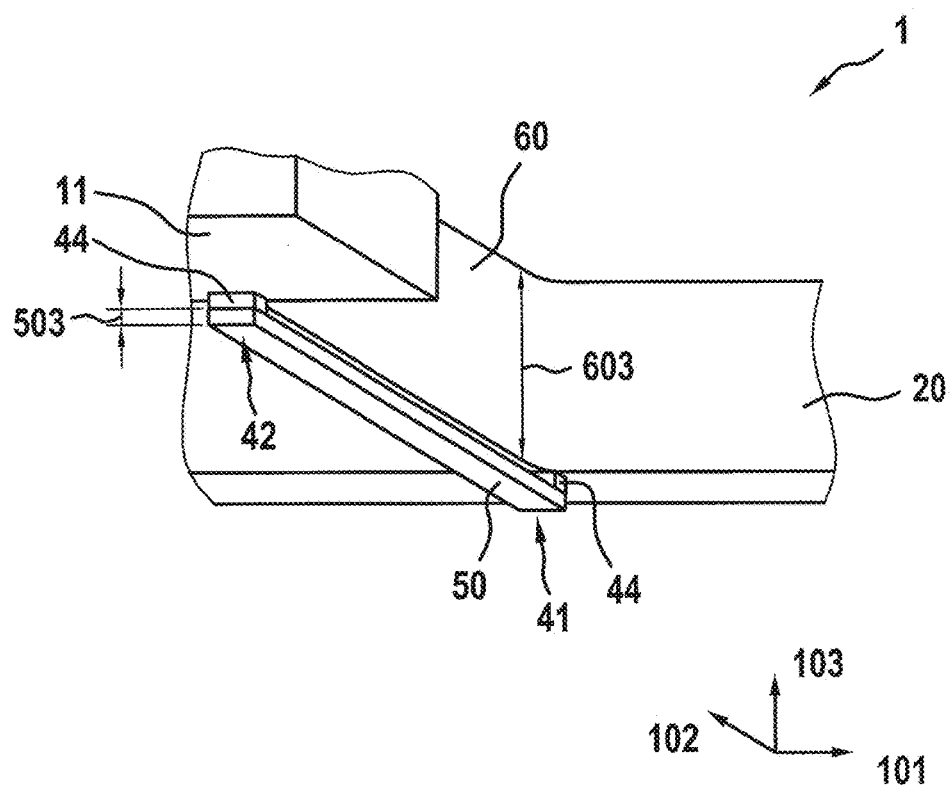

FIG. 7 illustrates a micromechanical sensor 1 according to one specific embodiment of the present invention. In the present case, torsion means 40 includes first torsion element 50 and second torsion element 60, first torsion element 50 being situated between second torsion element 60 and the substrate along a projection direction in parallel to Z direction 103, and essentially overlapping with second torsion element 60. In addition, first torsion element 50 has a first torsion element structure height 503 which extends along Z direction 103, and second torsion element 60 has a second torsion element structure height 603 which extends along Z direction 103. Furthermore, first torsion element 50 in particular is situated at a distance from second torsion element 60, and in particular is connected, solely indirectly, to second torsion element 60 at end 41 and other end 42, in each case via connecting elements 44.

Figure 8:
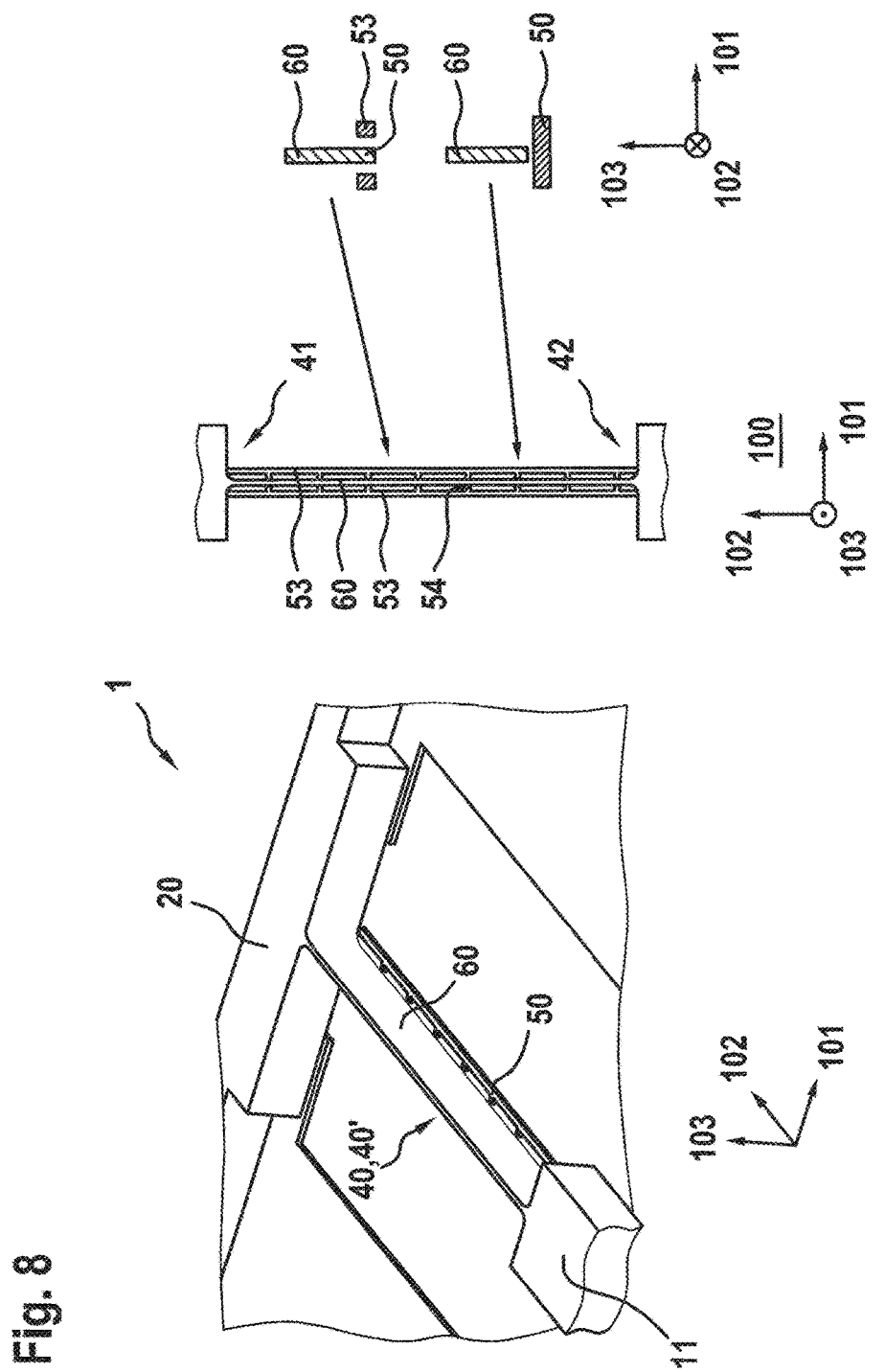

FIG. 8 illustrates a micromechanical sensor 1 according to one specific embodiment of the present invention. In the present case, torsion means 40, 40' which has the i shape or i structure also includes, in addition to first and second torsion element 50, 60, respectively, two bar elements 53 along Y direction 102 which in each case are situated at a distance, in particular the same distance, from the torsion axis, and which are connected to one another via bar connecting elements 54.

Figure 9:
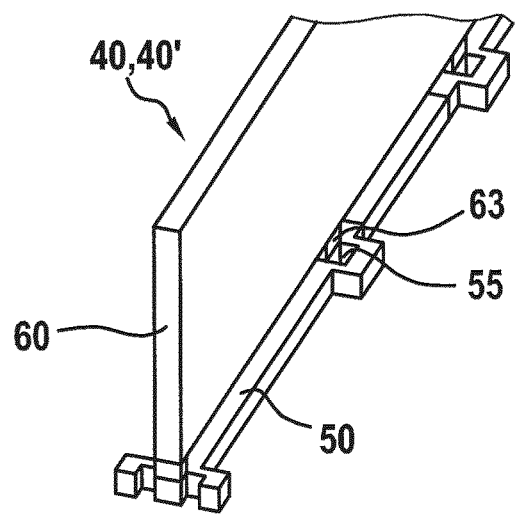
Figure 10:
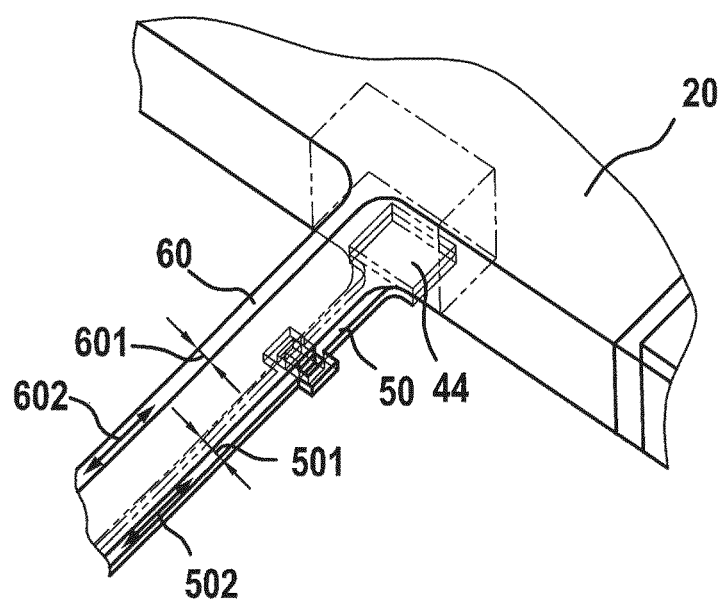
Figure 11:
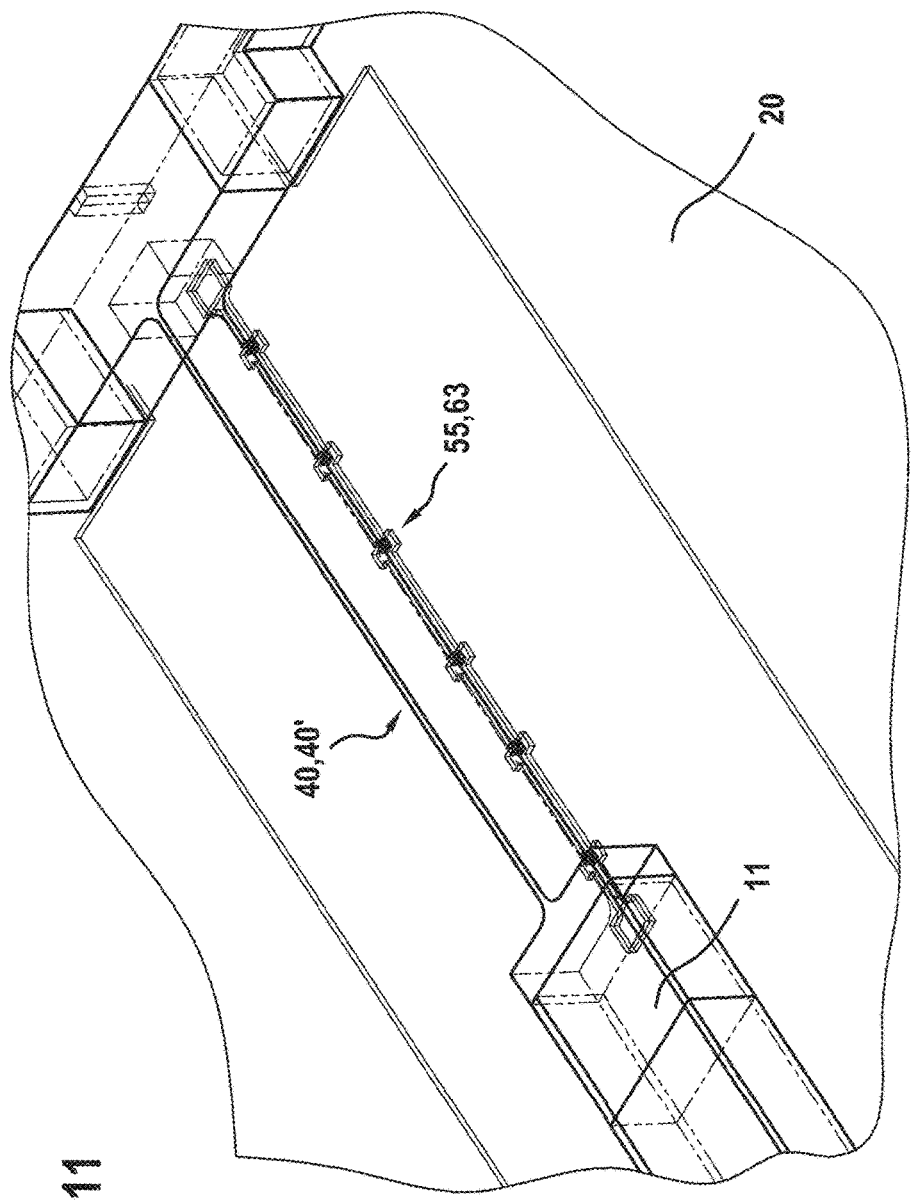

FIGS. 9, 10, and 11 illustrate a micromechanical sensor 1 according to one specific embodiment of the present invention in a perspective view. In the present case, first and second torsion elements 50, 60, respectively, are connected to one another, solely indirectly, for example, at least partially, i.e., along Y direction 102 at multiple areas which are situated at a distance from one another, with the aid of further connecting elements 63, also referred to as island elements. The connection may also be extended continuously over entire torsion means length 43 of torsion means 40. In particular, for an EP layer 200''' and an FP layer 200' which have different material properties, instability and/or spontaneous outward bending (so-called buckling) is/are thus advantageously largely avoided, in that in particular for long torsion means 40, 40' designed as i springs, multiple further connecting elements 63 are situated along torsion axis 102'.

It is illustrated in FIG. 10 that first torsion element 50 has first main direction of extension 501, and second torsion element 60 has second main direction of extension 502. In the present case, first torsion element 50 extends along a first torsion element width 501, and second torsion element 60 extends along a second torsion element width 601.

Figure 12:
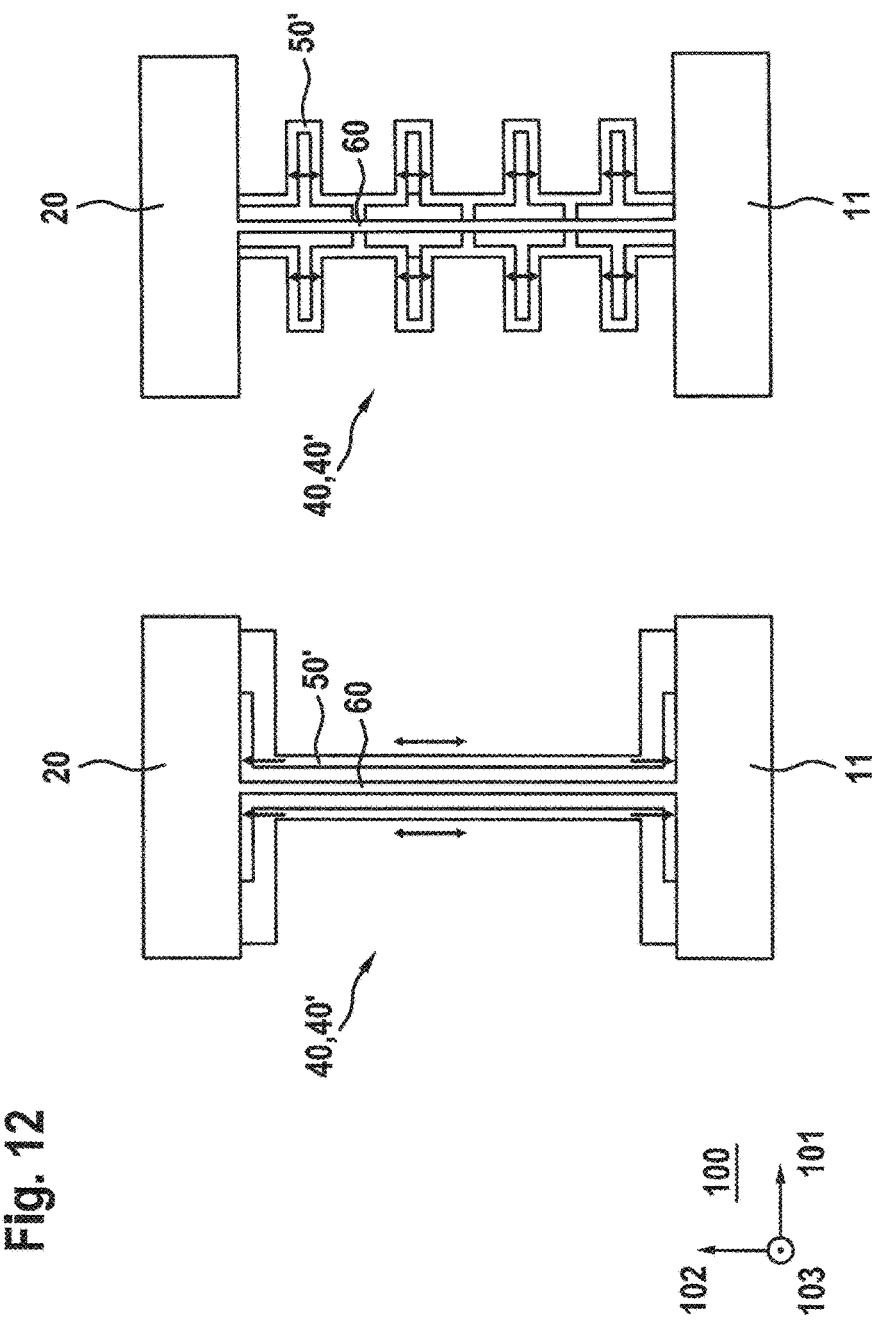

FIG. 12 illustrates a micromechanical sensor 1 according to one specific embodiment of the present invention, torsion means 40 here including a stress decoupling structure 50', stress decoupling structure 50' in particular including a spring element 50' which is deflectable along Y direction 102 and which in particular is completely formed from EP layer 200'.

Deflectable spring element 50' is preferably connected to EP layer 200''', for example, to rocker structure 20 and/or to first and/or second torsion element 50, 60, respectively, via two connecting elements 44.

Figure 13:
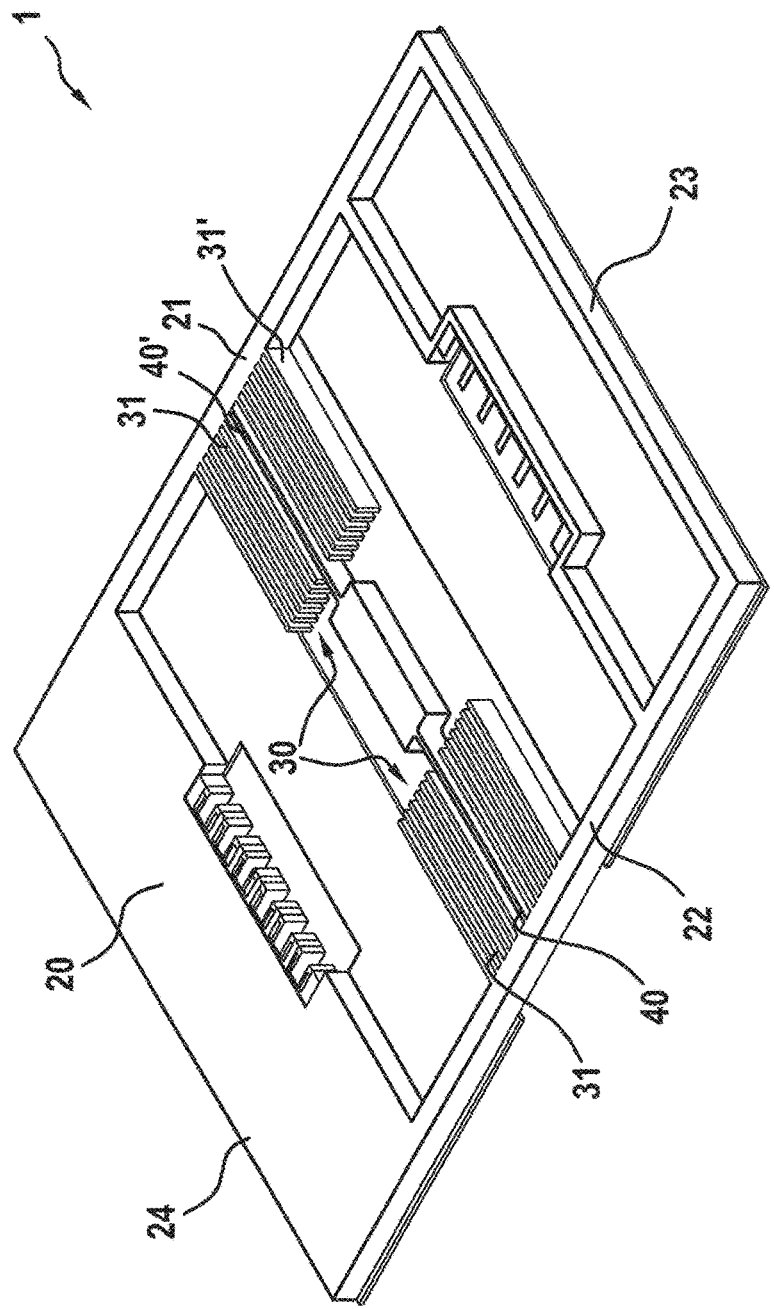
Figure 14:
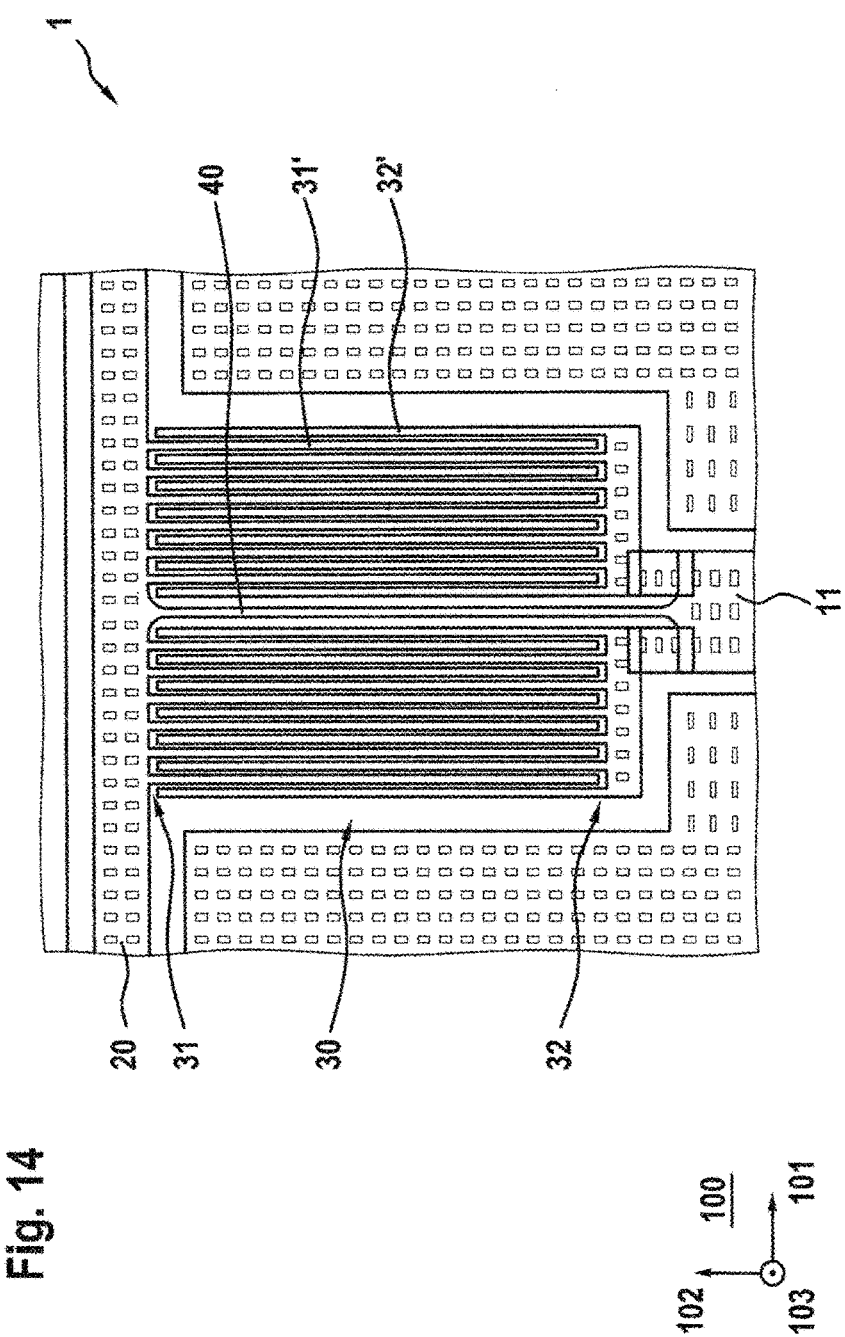

FIGS. 13 and 14 illustrate a micromechanical sensor 1 which includes a damping structure 30 according to one specific embodiment of the present invention, in a perspective view (FIG. 13) and a top view (FIG. 14). It has surprisingly been found that micromechanical sensor 1 according to the present invention is particularly insensitive to interfering mechanical vibrations, in particular when sensor 1 is installed in an engine compartment of a motor vehicle, since damping of the vibrational motion is achieved, in particular in addition to the separation of the first and second resonant frequencies, with the aid of damping structure 30. Damping structure 30 is configured here for damping a translational motion along X direction 101. In the present case, damping structure 30 includes two damping elements 31, 32, each damping element including one damping electrode 31 and one damping counter electrode 32 (see FIG. 14). The two damping elements 31, 32 are situated in a recess 25 in rocker structure 20 which extends through rocker structure 20 along a projection direction essentially in parallel to Z direction 103, and in particular are situated within a frame element which completely encloses rocker structure 20. In the present case, rocker structure 20 has a first side 21, a second side 22, a third side 23, and a fourth side 24. First and second sides 21, 22, respectively, are situated along torsion axis 102' at opposite ends of rocker structure 20, and third and fourth sides 23, 24, respectively, are situated along X direction 101 at opposite ends of rocker structure 20. In addition, a damping element 31, 32 is situated in each case on first and second sides 21, 22, respectively, damping electrodes 31 in each case including multiple finger electrodes 31', and damping counter electrodes 32 in each case including multiple counter finger electrodes 32'. Finger electrodes and counter finger electrodes 31', 32', respectively, in each case extend primarily along a finger electrode structure length 301 essentially in parallel to Y direction 102 (FIG. 14). Damping structure 30 is configured in particular in such a way that during a vibrational motion of rocker structure 20 along plane of vibration 100', a gas situated between finger electrodes 31 and counter finger electrodes 32 is compressed, and as a function of the compression of the gas a damping force is generated which damps the vibrational motion of rocker structure 20, in the present case along X direction 101. Similarly, a deflection of rocker structure 20 out of plane of vibration 100' may be damped.

Figure 15:
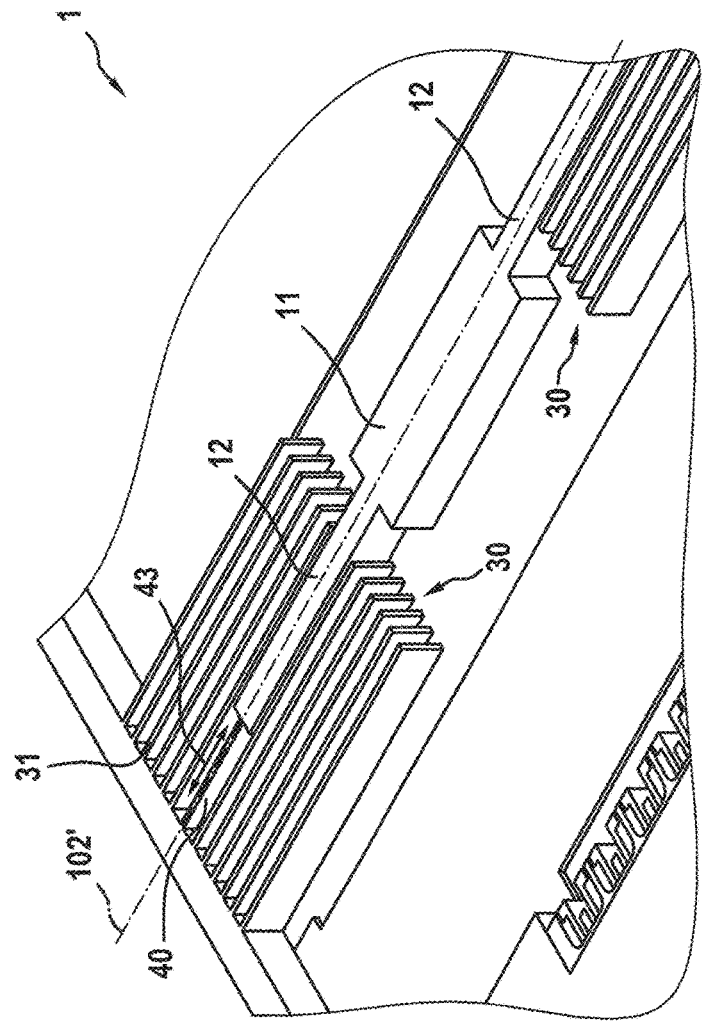

FIG. 15 illustrates a micromechanical sensor 1 according to one specific embodiment of the present invention. In the present case, the separation of the first and second resonant frequencies is achieved, for example, by shortening torsion means length 43 and correspondingly adjusting first and/or second torsion structure width 501, 601, respectively (see FIG. 10), so that the first resonant frequency is not changed, or is only insignificantly changed, when the second resonant frequency is increased by shortening torsion means length 43. Due to the shortening, the spring stiffness advantageously increases with respect to the vibrational motion along plane of vibration 100', and thus, the second resonant frequency disproportionately increases. Torsion means length 43 of unshortened torsion means 40, the so-called standard i spring, is preferably between 100 microns and 300 microns, particularly preferably between 150 microns and 250 microns, very particularly preferably essentially 190 microns. Alternatively, the torsion means length of torsion means 40, which is referred to as shortened here, is between 10 microns and 200 microns, preferably between 30 microns and 90 microns, very particularly preferably essentially 60 microns, as illustrated in FIG. 15, for example. Furthermore, in particular torsion means 40 is connected to the substrate via an anchoring bar element 12 of anchoring element 11.

FIG. 16 illustrates a micromechanical sensor 1 according to one specific embodiment of the present invention. In the present case, first torsion element 50 has a first ladder structure 51, 52, and second torsion element 60 has a second ladder structure 61, 62, first and/or second ladder structures 51, 52, 61, 62 each including two side rail elements 51, 61 which are connected to one another via multiple transverse webs 52, 62. In particular, according to the present invention the structure width of side rail elements 51, 61 and/or of transverse webs 52, 62 extending in parallel to main plane of extension 100 is preferably configured or adjusted in such a way that the cross-sensitivity is low.

Figure 17:
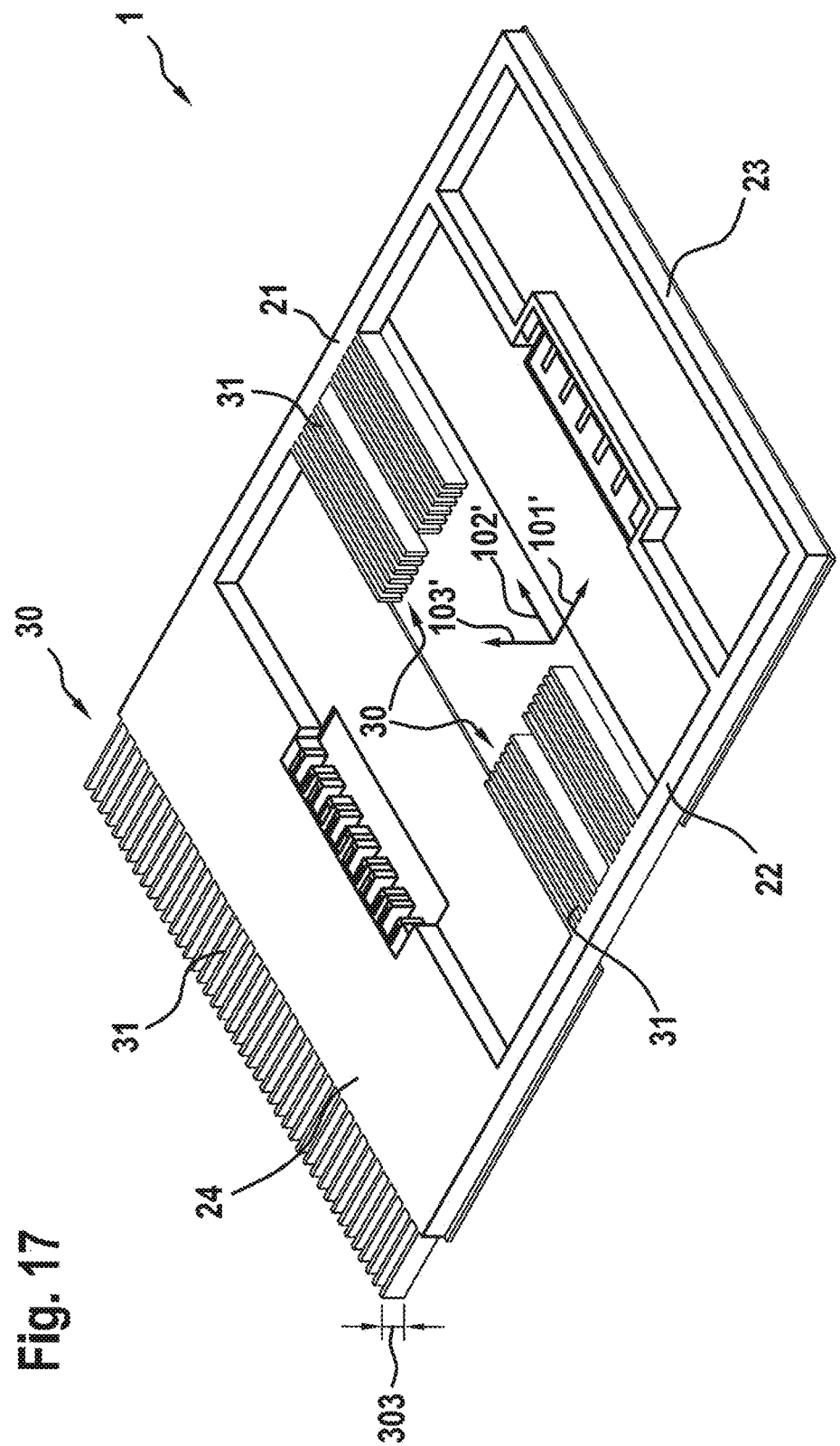

FIG. 17 illustrates a micromechanical sensor 1 according to one specific embodiment of the present invention. In the present case, damping structure 30 includes three damping elements 31, 32, one damping element 31, 32 of the three damping elements 31, 32 being situated on fourth side 24 so that a rotary motion of rocker structure 20 about an axis 103' essentially in parallel to Z direction 103 is damped. In addition, a damping element 31, 32 may also be situated on first, second, and/or third side 21, 22, 23, respectively, in order to damp, for example, a translational motion of rocker structure 20 along X direction 101 and/or Y direction 102. All finger electrodes 31' and/or counter finger electrodes 32' of damping element 31, 32 situated on the third side and or of all damping elements 31, 32 in each case preferably have a finger electrode structure height 303, extending along Z direction 103, which is less than rocker structure height 303 in particular in order to avoid an impact of the rocker structure during a torsional motion or tilting motion of rocker structure 20 about torsion axis 102'.

Figure 18:
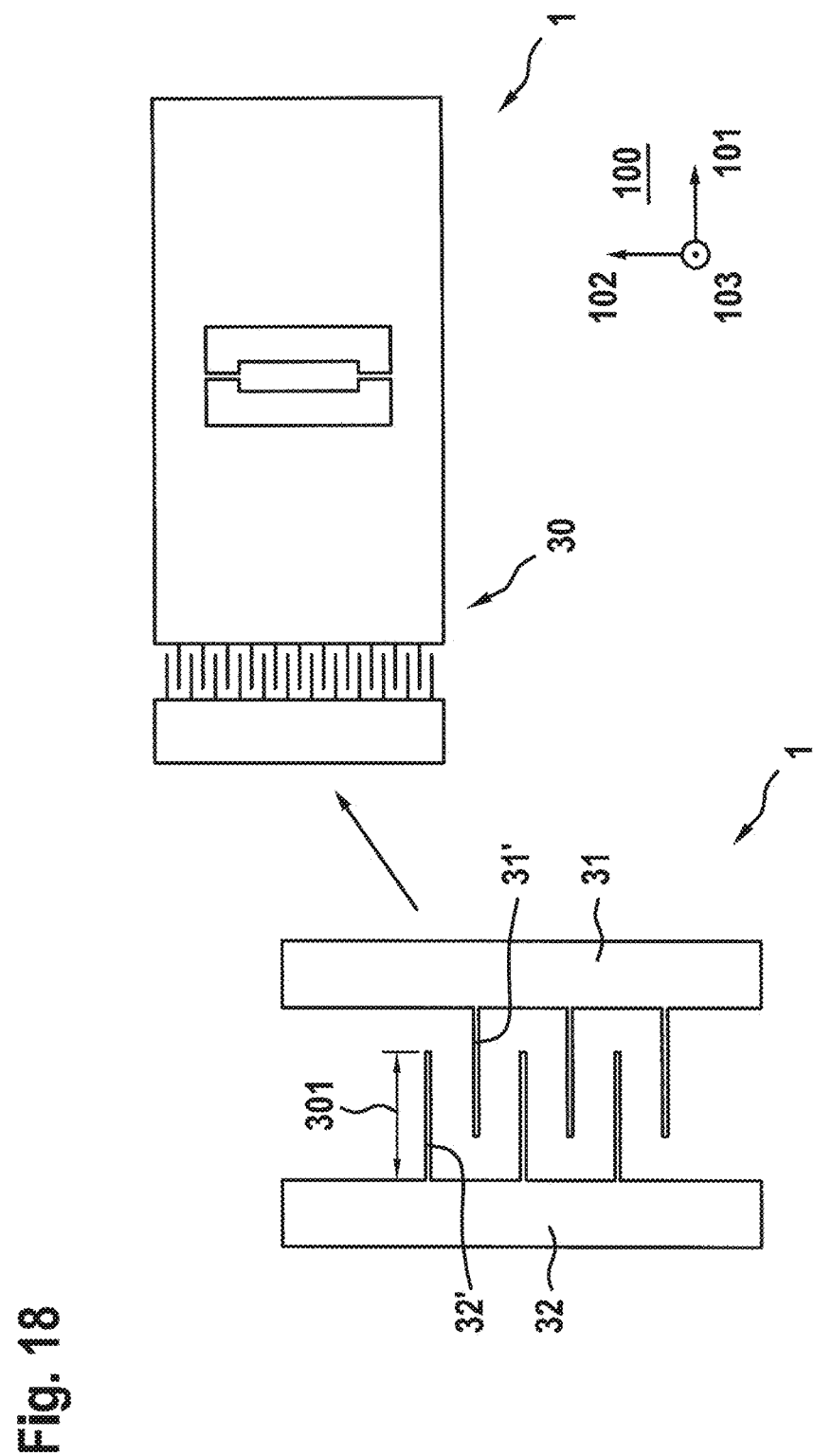
Figure 19:
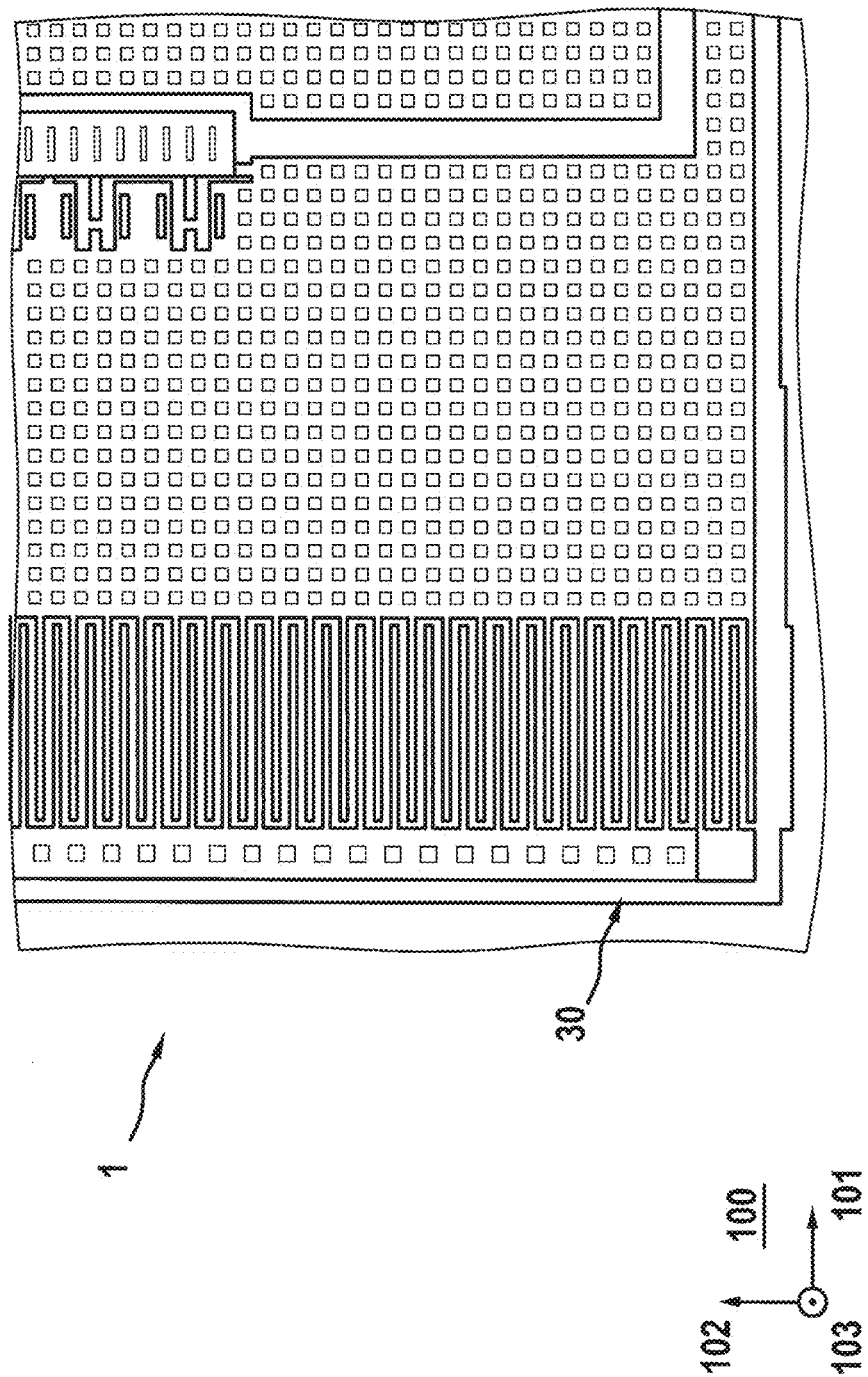

FIGS. 18 and 19 illustrate a micromechanical sensor 1 according to one specific embodiment of the present invention in various top views. In the present case, in particular the mode of action of finger electrodes and counter finger electrodes 31', 32', respectively, of damping structure 30 is illustrated. In particular, finger electrodes 31' and/or counter finger electrodes 32' each have a finger structure length 301 between 10 microns and 100 microns, preferably between 30 microns and 90 microns, particularly preferably approximately 68 microns. In addition, finger electrodes 31' and/or counter finger electrodes 32' in each case in particular have a structure width, extending perpendicularly with respect to a main direction of extension of finger electrodes 31' or counter finger electrodes 32', between 1 micron and 10 microns, preferably between 1 micron and 5 microns, particularly preferably approximately 2 microns. In particular, finger electrodes 31' and counter finger electrodes 32' in each case essentially have an electrode spacing along a direction which extends perpendicularly with respect to the main direction of extension of finger electrodes and counter finger electrodes 31', 32', respectively, the electrode spacing preferably being between 1 micron and 10 microns, particularly preferably between 3 microns and 6 microns, very particularly preferably approximately 4.3 microns.

What is claimed is:

1. A micromechanical sensor, comprising:
    a substrate having a main plane of extension;
    a torsion element;
    a rocker structure connected to the substrate via the torsion element, wherein:
        the torsion element extends primarily along a torsion axis situated essentially in parallel to the main plane of extension of the substrate,
        the rocker structure is pivotable about the torsion axis from a neutral position into a deflected position,
        the rocker structure includes a mass distribution which is asymmetrical with respect to the torsion axis, and
        the mass distribution is designed in such a way that a torsional motion of the rocker structure about the torsion axis is effected as a function of an inertial force on the rocker structure which is oriented along a Z direction which is essentially perpendicular to the main plane of extension of the substrate, wherein at least one of:

a damping structure is configured for damping a translational motion of the rocker structure along an X direction which is essentially in parallel to the main plane of extension of the substrate, and the torsion element includes a first torsion element and a second torsion element which is connected to the first torsion element, the first torsion element having a first main direction of extension which extends essentially in parallel to the torsion axis, and the second torsion element having a second main direction of extension which extends essentially in parallel to the torsion axis, the first and second main directions of extension being situated at a distance from one another along a projection direction which is essentially in parallel to the Z direction, the first and the second torsion element at least partially overlapping one another along the projection direction, the micromechanical sensor being configured in such a way that a first resonant frequency of a torsion mode of the rocker structure about the torsion axis is less than a second resonant frequency of a vibration mode of the rocker structure, the vibration mode including a vibrational motion of the rocker structure along a plane of vibration which is essentially in parallel to the main plane of extension.

2. The micromechanical sensor as recited in claim 1, wherein at least one of:

the vibrational motion includes a translational motion of the rocker structure along the X direction, the X direction being situated essentially perpendicularly with respect to the torsion axis, and the vibrational motion includes a rotary motion of the rocker structure about an axis which is essentially in parallel to the Z direction.

3. The micromechanical sensor as recited in claim 1, wherein the torsion element has a torsion element length which extends along the torsion axis from one end to another end of the torsion element, and wherein at least one of:

the torsion element length is less than one-half of a rocker width of the rocker structure which extends along the torsion axis, and the first torsion element has the torsion element length along the first main direction of extension, the second torsion element having the torsion element length along the second main direction of extension, the first and second torsion elements being connected to one another via two or more connecting elements, the two or more connecting elements being situated at a distance from one another along the Y direction.

4. The micromechanical sensor as recited in claim 3, wherein the torsion element length is less than one-third of the rocker width.

5. The micromechanical sensor as recited in claim 3, wherein the torsion element length is less than one-fourth of the rocker width.

6. The micromechanical sensor as recited in claim 3, wherein the torsion element length is less than one-fifth of the rocker width.

7. The micromechanical sensor as recited in claim 3, wherein the first and second torsion elements are connected to one another solely indirectly.

8. The micromechanical sensor as recited in claim 1, wherein the rocker structure includes a further torsion element that extends primarily along the torsion axis, the torsion element and the further torsion element in each case being connected to the rocker structure at ends facing away from each other, and in each case being connected to the substrate at ends facing each other via an anchoring element situated between the torsion element and the further torsion means element, the torsion element length of the torsion element and a further torsion element length of the further torsion means being essentially equal.

9. The micromechanical sensor as recited in claim 1, wherein the first torsion element has a first torsion element structure width which extends essentially in parallel to the main plane of extension, and a first torsion element structure height which extends essentially in parallel to the Z direction, the second torsion element having a second torsion element structure width which extends essentially in parallel to the main plane of extension, and a second torsion element structure height which extends essentially in parallel to the Z direction, at least one of the first and second torsion element structure widths and the first and second torsion element structure heights being configured in such a way that the first resonant frequency is less than the second resonant frequency, wherein at least one of:

the first torsion element structure width being 0.5 times to 2 times the second torsion element structure width, and/or the first torsion element structure height being 0.01 times to 0.4 times the second torsion element structure height.

10. The micromechanical sensor as recited in claim 9, wherein the first resonant frequency is less than the second resonant frequency by one order of magnitude.

11. The micromechanical sensor as recited in claim 9, wherein the first torsion element structure width is 0.8 times to 1.4 times the second torsion element structure width.

12. The micromechanical sensor as recited in claim 9, wherein the first torsion element structure width is 1.0 times to 1.2 times the second torsion element structure width.

13. The micromechanical sensor as recited in claim 9, wherein the first torsion element structure height is 0.05 times to 0.2 times the second torsion element structure height.

14. The micromechanical sensor as recited in claim 9, wherein the first torsion element structure height is 0.1 times the second torsion element structure height.

15. The micromechanical sensor as recited in claim 1, wherein at least one of:

at least one of the first torsion element has a first ladder structure and the second torsion element has a second ladder structure, at least one of the first ladder structure and the second ladder structure each having two side rail elements which are connected to one another via multiple transverse webs, and at least one of the first torsion element extends essentially along the first main direction of extension in a meandering manner and the second torsion element extends essentially along the second main direction of extension in a meandering manner.

16. The micromechanical sensor as recited in claim 1, wherein the damping structure is configured for damping the translational motion of the rocker structure along the X direction and/or for damping the rotary motion of the rocker structure about the axis, in particular the damping structure including one or multiple damping elements, in particular the one or multiple damping elements being situated in a recess in the rocker structure which extends through the rocker structure along a projection direction which is essentially in parallel to the Z direction, and/or being situated on a first side, a second side, a third side and/or a fourth side, preferably on opposite sides, of the rocker structure, in the neutral position in particular the first, second, third, and/or fourth side(s) in each case being situated in the plane of vibration and/or being situated between the substrate and the rocker structure along a projection direction in parallel to the Z direction and/or being situated above the rocker structure along a projection direction in parallel to the Z direction.

17. The micromechanical sensor as recited in claim 16, wherein each of the one or multiple damping elements of the damping structure includes a damping electrode which is immovably connected to the rocker structure, and a corresponding damping counter electrode which is immovably connected to the substrate, in particular the one or multiple damping elements in each case being configured for damping with the aid of sliding film damping and/or squeeze film damping.

18. The micromechanical sensor as recited in claim 17, wherein the damping electrode includes multiple finger electrodes, and the damping counter electrode includes multiple counter finger electrodes), the multiple finger electrodes each having a finger structure height which extends along the Z direction, the rocker structure having a rocker structure height which extends along the Z direction, the finger structure height being essentially less than the rocker structure height.

19. A method for manufacturing a micromechanical sensor, comprising:
   providing a substrate having a main plane of extension in a first manufacturing step;
   connecting a rocker structure to the substrate via a torsion element extending primarily along a torsion axis situated essentially in parallel to the main plane of extension of the substrate, wherein the rocker structure is designed in such a way that the rocker structure is pivotable about the torsion axis from a neutral position into a deflected position, a mass distribution of the rocker structure being asymmetrical with respect to the torsion axis in such a way that a torsional motion of the rocker structure about the torsion axis is effected as a function of an inertial force on the rocker structure which is oriented along a Z direction essentially perpendicular to the main plane of extension of the substrate;
   connecting a damping structure to the micromechanical sensor in a second manufacturing step, the damping structure being configured for damping a translational motion of the rocker structure along an X direction which is essentially in parallel to the main plane of extension;
   forming a first torsion element and a second torsion element connected to the first torsion element from the torsion element in a third manufacturing step, a first main direction of extension of the first torsion element and a second main direction of extension of the second torsion element in each case being situated essentially in parallel to the torsion axis, the first and second main directions of extension being situated at a distance from one another along a projection direction which is essentially in parallel to the Z direction, the first and the second torsion elements at least partially overlapping one another along the projection direction; and
   configuring the torsion element in a fourth manufacturing step in such a way that a first resonant frequency of a torsion mode of the rocker structure about the torsion axis is less than a second resonant frequency of a vibration mode of the rocker structure, the vibration mode including a vibrational motion of the rocker structure along a plane of vibration which is essentially in parallel to the main plane of extension.

* * * * *